US006277686B1

(12) United States Patent
Yeh et al.

(10) Patent No.: US 6,277,686 B1
(45) Date of Patent: Aug. 21, 2001

(54) PIP CAPACITOR FOR SPLIT-GATE FLASH PROCESS

(75) Inventors: Chung-Ker Yeh; Hung-Cheng Sung; Di-Son Kuo, all of Hsin-Chu; Chia-Ta Hsieh, Tainan; Yai-Fen Lin, Non-Tour, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/347,546

(22) Filed: Jul. 6, 1999

(51) Int. Cl.$^7$ ................................................. H01L 21/8242
(52) U.S. Cl. ........................... 438/241; 438/266; 438/532
(58) Field of Search ................................. 438/239, 241, 438/253, 258, 266, 267, 532

(56) References Cited

U.S. PATENT DOCUMENTS 5,550,072 * 8/1996 Cacharelis et al. ................. 438/241
6,015,984 * 1/2000 Leu ...................................... 438/266

* cited by examiner

Primary Examiner—Chandra Chaudhari
(74) Attorney, Agent, or Firm—George O. Saile; Stephen B. Ackerman; Sevgin Oktay

(57) ABSTRACT

A PIP (Poly-Interpoly-Poly) capacitor with high capacitance is provided in a split-gate flash memory cell. A method is also disclosed to form the same PIP capacitor where the bottom and top plates of the capacitor are formed simultaneously with the floating gate and control gate, respectively, of the split-gate flash memory cell. Furthermore, the thin interpoly oxide of the cell, rather than the thick poly-oxide over the floating gate is used as the insulator between the plates of the capacitor. The resulting capacitor yields high storage capacity through high capacitance per unit area.

21 Claims, 7 Drawing Sheets

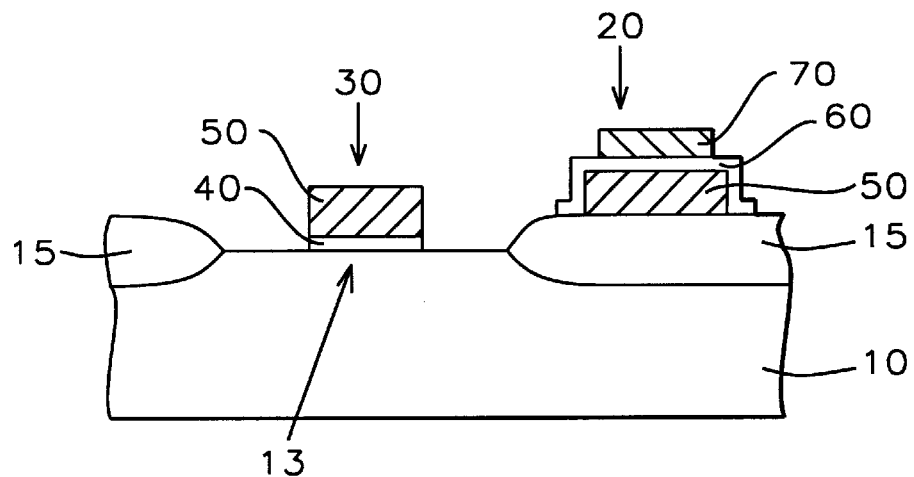
*FIG. 1 — Prior Art*
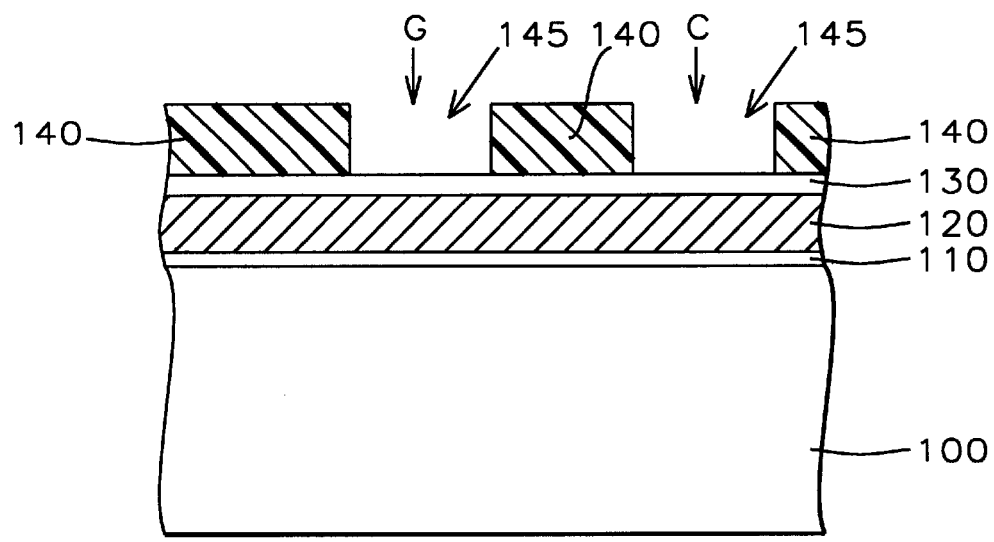
*FIG. 2a*
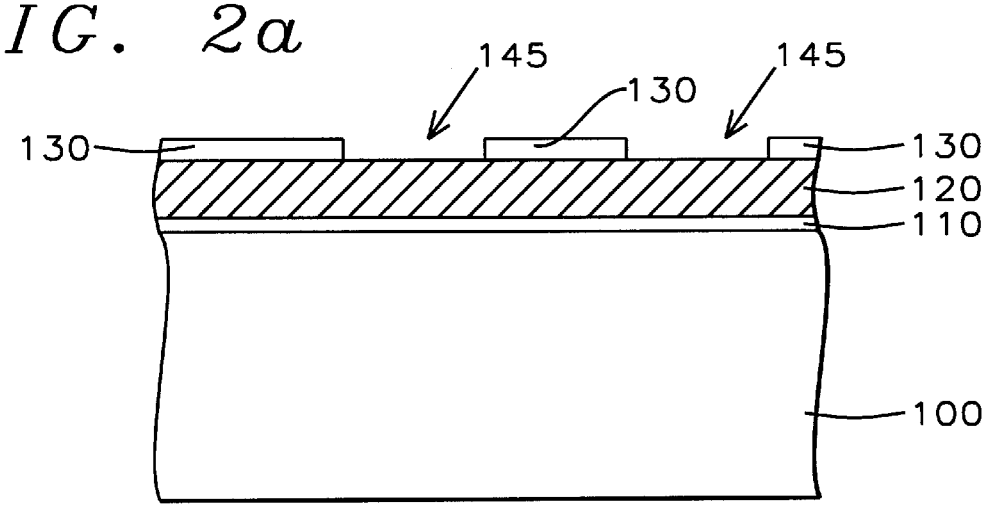
*FIG. 2b*

PIP CAPACITOR FOR SPLIT-GATE FLASH PROCESS

BACKGROUND OF THE INVENTION (1) Field of the Invention

The present invention relates to semiconductor manufacturing and is more particularly directed to a split-gate flash memory cell having a PIP (Poly-Interpoly oxide Poly) capacitor with high unit capacitance, and also to a method of forming the same.

(2) Description of the Related Art

With the ever-decreasing of feature sizes, including that of capacitor areas, in very large and ultra large integrated circuit technologies (VLSI and ULSI) of related art, the parameters that affect the capacitance of capacitors are requiring closer scrutiny in order to be able keep the unit capacitance values from being lowered further. That is, a solution must be found to meet the contradictory requirements for increasing the packing density of memory cells on the one hand, and increasing the storage capacity of the same, on the other. As is known in the art, the most important parameters involved in increasing the capacitance of a capacitor are the area of the capacitor, and the dielectric constant and the thickness of the insulator between the plates of the capacitor. It is shown later in the embodiments of the present invention that the low unit capacitance of a conventional split-gate flash memory cell can be increased by simultaneously forming a PIP capacitor together with the polysilicon (poly) gates of the cell where the floating gate poly is used as the bottom plate, the gate oxide as the inter-poly oxide, and the control gate poly as the top plate of the PIP capacitor.

It is common in related art to form capacitors, in addition to resistors, transistors and diodes, in integrated circuits of various types. Capacitors formed within analog integrated circuit fabrications typically assure proper operation of those analog integrated circuits. Capacitors formed within digital integrated circuits typically provide charge storage locations for individual bits of digital data stored with those digital integrated circuits.

A known type of capacitor that is typically, though not exclusively, formed with an integrated circuit is a double layer polysilicon capacitor. Double layer polysilicon capacitors are formed from two substantially planar conductive polysilicon electrodes separated by a dielectric layer. Double layer polysilicon capacitors provide several advantages when used within integrated circuits. For example, double layer polysilicon capacitors may easily be formed within several locations within an integrated circuit.

Such a double layer polysilicon capacitor is shown within a Field Effect Transistor (FET) in FIG. 1. Capacitor (20) is formed along with poly-gate (30) on the same substrate (10). Field oxide (15) defines active region (13) of substrate (10). Poly-gate (30), formed over the active region, comprises a patterned first polysilicon layer (50) separated from substrate (10) by an intervening layer of gate oxide (40). The first bottom plate, or electrode, of capacitor (20) is formed simultaneously from the same first polysilicon layer (50) of poly-gate (30) over the field oxide region (15), as shown in FIG. 1. A patterned insulator layer (60) is next formed over first electrode (50), and a second patterned polysilicon layer (70) over the insulator. Thus, the patterned second polysilicon layer (70) forms the second polysilicon electrode of the double layer polysilicon capacitor (20).

Use of double layer polysilicon capacitors in integrated circuits is common in prior art. Yoo, et al., of U.S. Pat. No. 5,866,451 discloses a method of making a mixed-mode capacitor suitable for either digital or analog circuits integrated with logic and memory in the same chip. A second layer polysilicon layer is patterned to form the top plate of a double layer capacitor in the same chip. In U.S. Pat. No. 5,631,188, Chang, et al., show a double layer polysilicon capacitor exhibiting low voltage coefficient and a method for forming the same. Pan of U.S. Pat. No. 5,858,832, on the other hand, teaches a method of forming within an integrated circuit a high areal capacitance planar capacitor. A split-gate flash EEPROM cell is disclosed by Ahn in U.S. Pat. No. 5,652,161.

In the present invention, a different double layer polysilicon capacitor in a split-gate flash memory cell is disclosed. When a double layer polysilicon capacitor is formed simultaneously with the forming of a split-gate flash memory cell, as described later in the embodiments of the present invention, if the poly-oxide between the floating gate and the control gate of the split-gate flash is used as the insulator between the first and second electrodes of the capacitor, then the unit capacitance of the capacitor becomes low due to the excessive thickness of the poly-oxide. It is disclosed later in the embodiments that with a judicious use of an additional masking step, a much thinner gate-oxide, in place of the thick poly-oxide, can be used, thereby achieving a Poly-Interpoly-Poly (PIP) capacitor with higher unit capacitance in a split-gate flash memory cell.

SUMMARY OF THE INVENTION

It is therefore, an object of this invention to provide a PIP (Poly-Interpoly-Poly) capacitor with high capacitance in a split-gate flash memory cell.

It is another object of the present invention to provide a method of forming a PIP capacitor with high capacitance in a split-gate flash memory cell.

It is still another object of this invention to provide a method of forming a PIP capacitor having its first and second electrodes simultaneously formed with the polysilicon floating and control gates, respectively, of a split-gate flash memory cell.

It is yet another object of the present invention to provide a method of using the thin gate oxide layer of a split-gate flash memory cell in place of the poly-oxide of the polysilicon layer as the insulating layer between the electrodes of a PIP capacitor, thus yielding a high unit capacitance and high storage capacity for the memory cell.

These objects are accomplished by providing a semiconductor substrate having a gate region and a capacitor region, and a first gate dielectric layer formed thereon; a first polysilicon layer forming the floating gate of said memory cell in said gate region, and the first electrode of said PIP capacitor in said capacitor region; a second polysilicon layer forming the control gate of said memory cell in said gate region, and the second electrode of said PIP capacitor in said capacitor region; a second gate dielectric layer and a poly-oxide layer between the floating gate and the control gate in said gate region; and a third gate dielectric layer as the insulator layer between said first electrode and said second electrode of said PIP capacitor.

The objects are further accomplished by providing a semiconductor substrate having a gate region and a capacitor region, and a first gate dielectric layer formed thereon; depositing a first polysilicon layer to form the floating gate of said memory cell in said gate region, and to form the first electrode of said PIP capacitor in said capacitor region; forming a poly-oxide layer over said first polysilicon layer;

forming a second gate dielectric layer over said substrate including said gate region and said capacitor region; ion implanting said first polysilicon layer in said capacitor region to control dopant level in said first electrode of said PIP capacitor; performing an oxide dip to remove said second gate dielectric layer from said substrate; forming a third gate dielectric layer over said substrate including over said poly-oxide layer over said floating gate, and over said first electrode of said PIP capacitor; and depositing a second polysilicon layer to form the control gate of said memory cell in said gate region, and to form the second electrode of said PIP capacitor in said capacitor region on said substrate.

BRIEF DESCRIPTION OF THE DRAWINGS

FIG. 1 is a cross-sectional view of a semiconductor substrate showing the forming of a conventional planar capacitor along with a poly gate of prior art.

FIGS. 2a–2f show the various process steps of forming a conventional double layer polysilicon capacitor simultaneously with the forming of a split-gate flash memory cell as currently practiced in the present manufacturing line.

FIG. 3a is a cross-sectional view of a semiconductor substrate showing the forming and patterning of a photoresist layer on successively formed layers of gate oxide, polysilicon and nitride according to this invention.

FIG. 3b is a cross-sectional view of a semiconductor substrate showing the ion implanting of the first polysilicon layer of FIG. 3a, according to this invention.

FIG. 3c is a cross-sectional view of a semiconductor substrate showing the removal of the photoresist layer from the substrate of FIG. 3b, according to this invention.

FIG. 3d is a cross-sectional view of a semiconductor substrate showing the forming of poly-oxide on the polysilicon layer of FIG. 3c, according to this invention.

FIG. 3e is a cross-sectional view of a semiconductor substrate showing the forming of a second photoresist layer on the capacitor region of the substrate of FIG. 3d, according to this invention.

FIG. 3f is a cross-sectional view of a semiconductor substrate showing the forming of a second gate dielectric layer on the floating gate and the bottom plate, or the first electrode, in the capacitor region of FIG. 3e, according to this invention.

FIG. 3g is a cross-sectional view of a semiconductor substrate showing the patterning of a third photoresist layer and the ion implanting on the capacitor region of the substrate of FIG. 3d, according to this invention.

FIG. 3h is a cross-sectional view of a semiconductor substrate showing the forming of a third gate dielectric layer on the floating gate and first electrode in the capacitor region of FIG. 3g, according to this invention.

FIG. 3i is a cross-sectional view of a semiconductor substrate showing the forming of the control gate and the top plate, or the second electrode, of the PIP capacitor of this invention formed simultaneously with the split-gate flash memory cell, according to this invention.

DESCRIPTION OF THE PREFERRED EMBODIMENTS

Referring now to drawings 2a–2f and 3a–3i, there are shown alternate methods of forming a double layer poly-silicon capacitor. The preferred method shown in FIGS. 3a–3i yield a PIP (Poly-Interpoly-Poly) capacitor having high capacitance per unit area. In the method shown in FIGS. 2a–2f as currently practiced in the manufacturing line, a thick poly-oxide forms the insulator between the first and second electrodes -bottom and top plates, respectively- of the double layer polysilicon capacitor, thus resulting in low unit capacitance. It is disclosed later that by employing different methods, the PIP capacitor insulator can be formed from a much thinner gate oxide layer, thus yielding much higher unit capacitance.

Figure 2C:
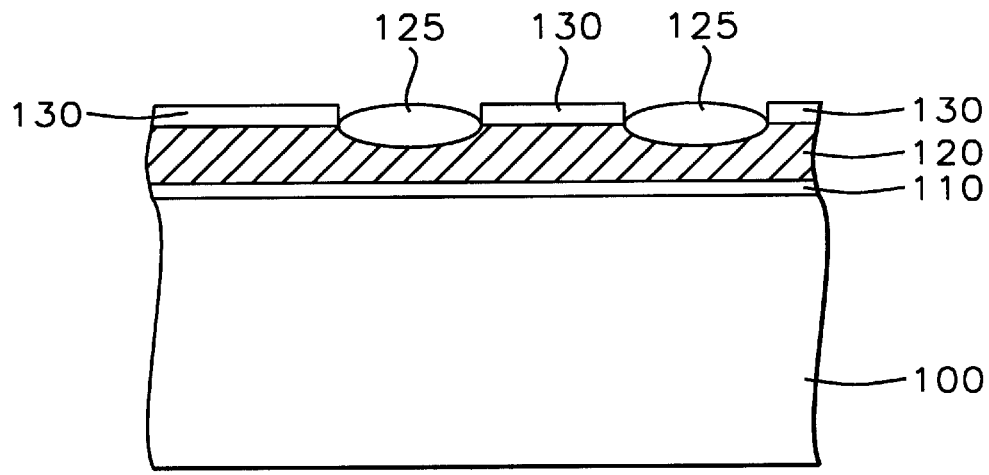
Figure 2D:
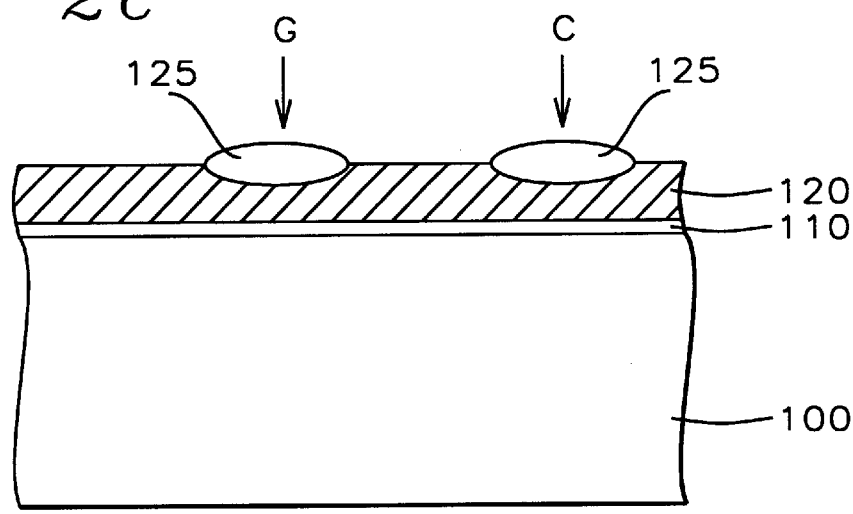
Figure 2E:
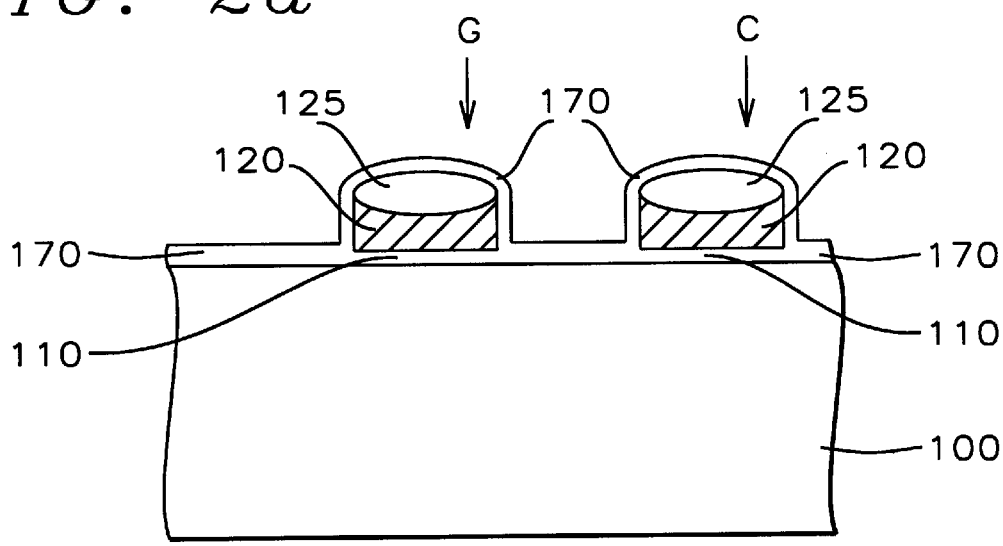
Figure 2F:
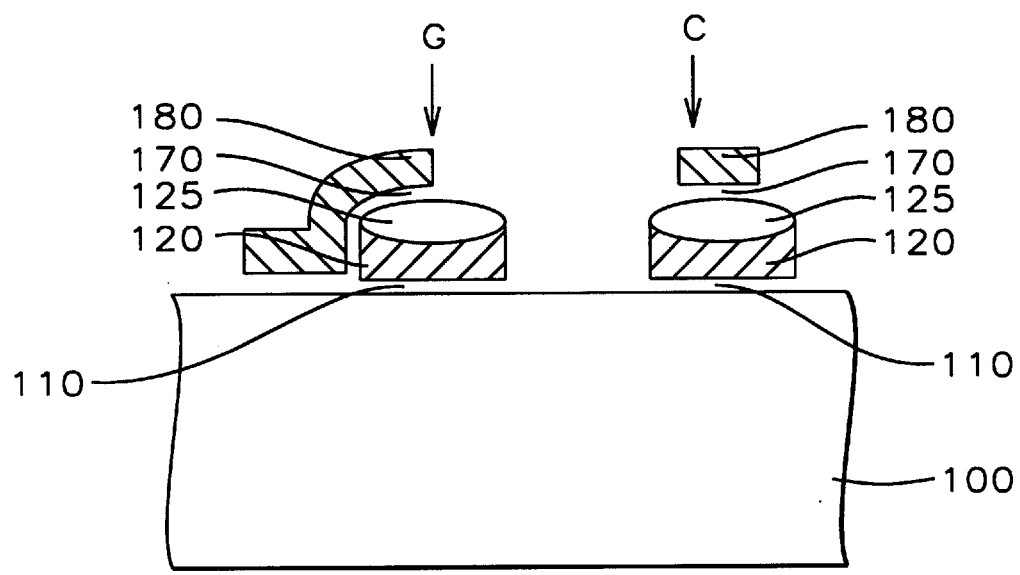

In current practice, substrate (100) is provided with gate region (G) and capacitor region(C) as shown in FIG. 2a. A first gate dielectric layer, or floating gate oxide layer (110), is formed over both (G) and (C) regions on the substrate, followed by the forming of first polysilicon layer (120) and then nitride layer (130) as shown also in FIG. 2a. A photoresist layer (140) is next formed and patterned over the substrate with openings (145) corresponding to gate and capacitor regions. Hole patterns (145) are then transferred into nitride layer (130) by etching the nitride layer while using photoresist layer (140) as a mask as shown in FIG. 2b. Subsequently, the photoresist layer is removed and now using the patterned nitride layer as a hard-mask, the portions of the first polysilicon layer exposed at the bottom of the openings in the nitride layer are wet-oxidized to form poly-oxide layers (125) as shown in FIG. 2c. The nitride layer is no longer needed, therefore, removed as seen in FIG. 2d. Using poly-oxide layers (125) as another hard-mask, the portions of the exposed first polysilicon layer are etched to form a floating gate in region (G) and the bottom plate or the first electrode of a capacitor in region (C) from the same polysilicon layer (120) as shown in FIG. 2e. Next, an intergate or interpoly dielectric layer (170) is conformally formed both over the floating gate and the first electrode, that is, over layer (120), including over the poly-oxide layers (125), as shown in FIG. 2e. It will be noted that layer (170) is primarily needed on the sidewalls of the floating gate as an intergate dielectric between floating gate (120) and control gate (180) to be formed next, as shown in FIG. 2f. Poly-oxide layer (125) serves as an insulator on the top portions of both the floating gate and first electrode. Both the control gate and the second electrode, or the top plate of the capacitor are formed together by depositing a second polysilicon layer (180) over the conformal dielectric layer (170) and patterning it as shown in FIG. 2f. It is the thick combined poly-oxide layer (125) along with the dielectric layer (170) which serve as the insulator for the capacitor that causes the unit capacitance of the double layer polysilicon capacitor to be low, as described below.

In the preferred embodiment shown in FIGS. 3a–3i, the unit capacitance of the disclosed PIP capacitor is increased substantially by substituting a thin gate dielectric layer in place of the presently used poly-oxide layer as the insulator between the electrodes of the capacitor.

Figure 3A:
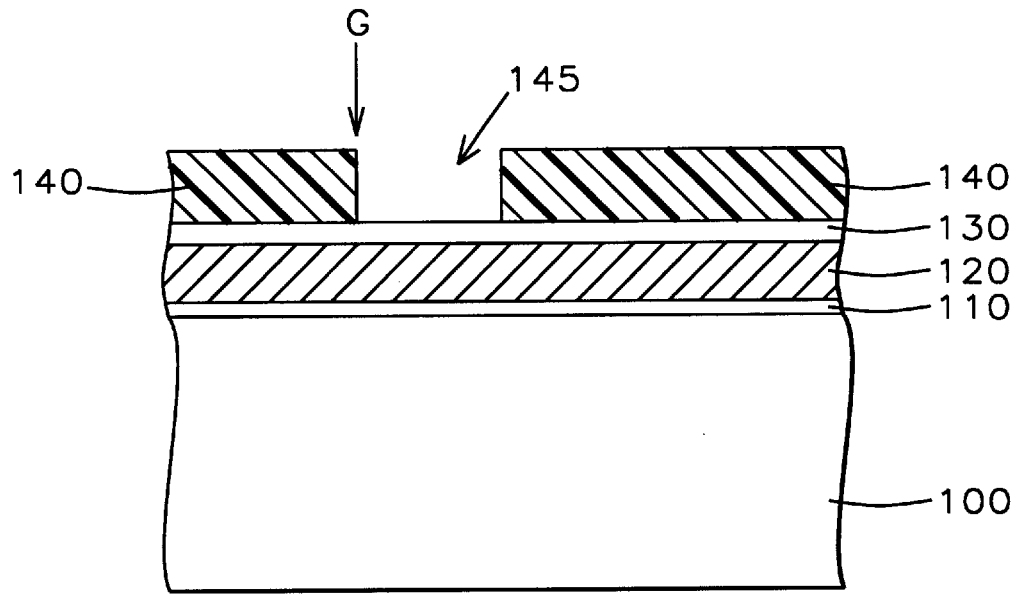
FIGS. 3a–3i show the various process steps of forming a new Poly-Interpoly-Poly (PIP) capacitor simultaneously with the forming of a split-gate flash memory cell, according to the present invention. More specifically.

In FIG. 3a, substrate (100) is provided with a first gate dielectric layer (110) having a thickness between about 70 to 150 Å. The dielectric layer is preferably an oxide formed by thermal oxidation in an oxidation furnace at a temperature range between about 700 to 1000° C. Alternatively, the oxide can be formed by an atmospheric or low pressure chemical vapor deposition process as is well known.

A first polysilicon layer (120) is next formed over the first gate dielectric layer through an LFCVD method employing silane $SiH_4$ as a silicon source material at a temperature range between about 500 to 700° C. It is preferred that the thickness of the first polysilicon layer is between about 500 to 2000 Å.

This is followed by the forming of nitride layer (130) also shown in FIG. 3a. Nitride layer is formed by reacting dichlorosilane ($SiCl_2H_2$) with ammonia ($NH_3$) in an LPCVD at a temperature range between about 700 to 800° C. with a preferred thickness between about 500 to 1500 Å.

Figure 3B:
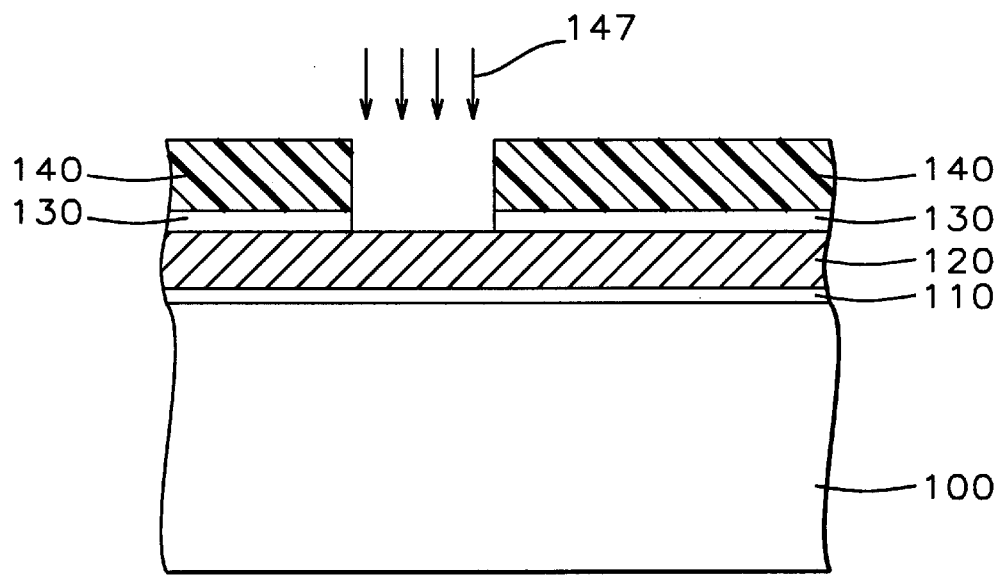
Figure 3C:
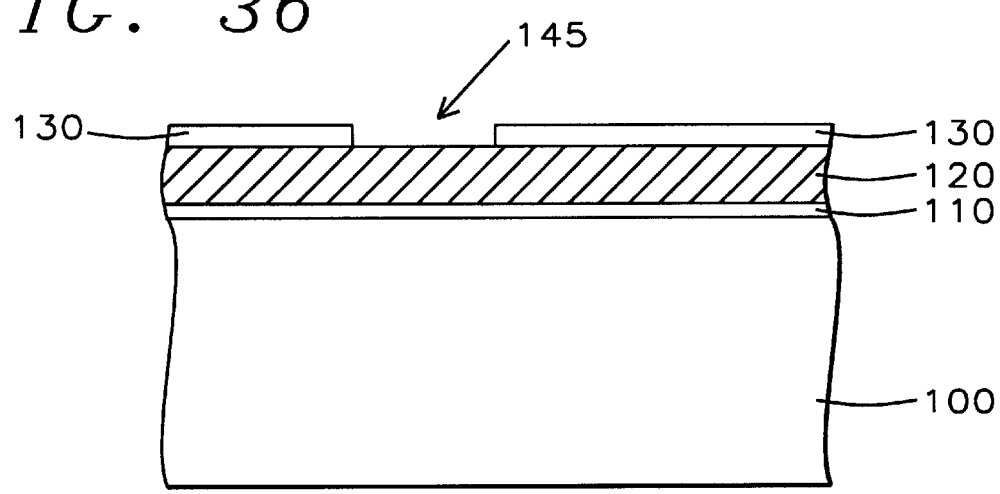

A photoresist layer (140) is next formed to a thickness between about 0.8 to 1.2 micrometers ($\mu m$), and patterned over the substrate with an opening (145) corresponding to a gate region (G). Hole pattern (145) is then transferred into nitride layer (130) by etching the nitride layer using photoresist layer (140) as a mask as shown in FIG. 3b. Preferably the nitride layer is dry etched using gases $CHF_3$ and $CF_4$. Before the photoresist layer is removed, first polysilicon layer is implanted using phosphorous or arsenic ions (147) at a dosage level between about $1\times10^{14}$ to $1\times10^{15}$ atoms/$cm^2$ and energy level between about 10 to 40 KeV as shown in the same FIG. 3b. The implant will then aid in the next step of oxidization of the polysilicon layer.

Figure 3D:
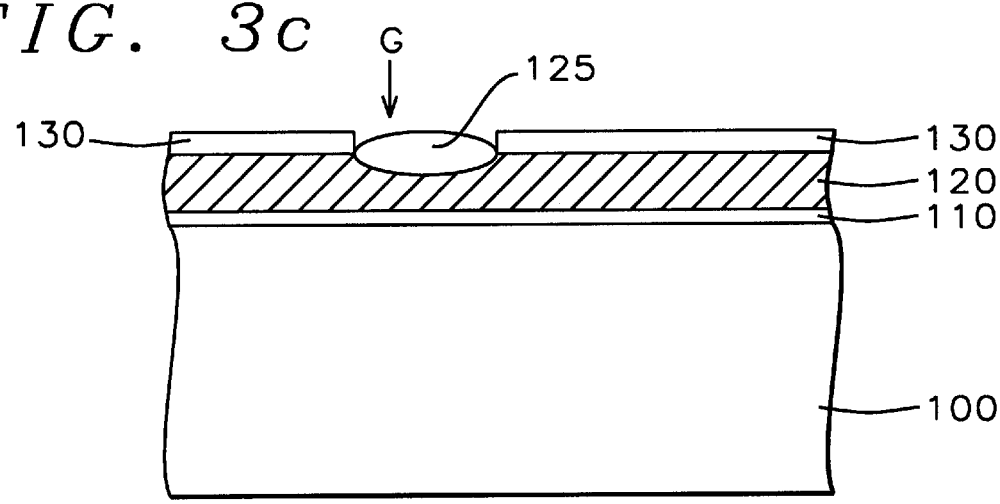

Subsequently, the first photoresist layer is removed (FIG. 3c) by oxygen plasma ashing, and now using the patterned nitride layer as a hard-mask, the portion of the first polysilicon layer exposed at the bottom of opening (145) in the nitride layer is wet-oxidized to form poly-oxide layer (125) shown in FIG. 3d. It is preferred that the oxidization temperature is between about 800 to 1000° C. Afterwards, nitride layer (130) is removed exposing the first polysilicon layer not covered by poly-oxide layer (125).

Figure 3E:
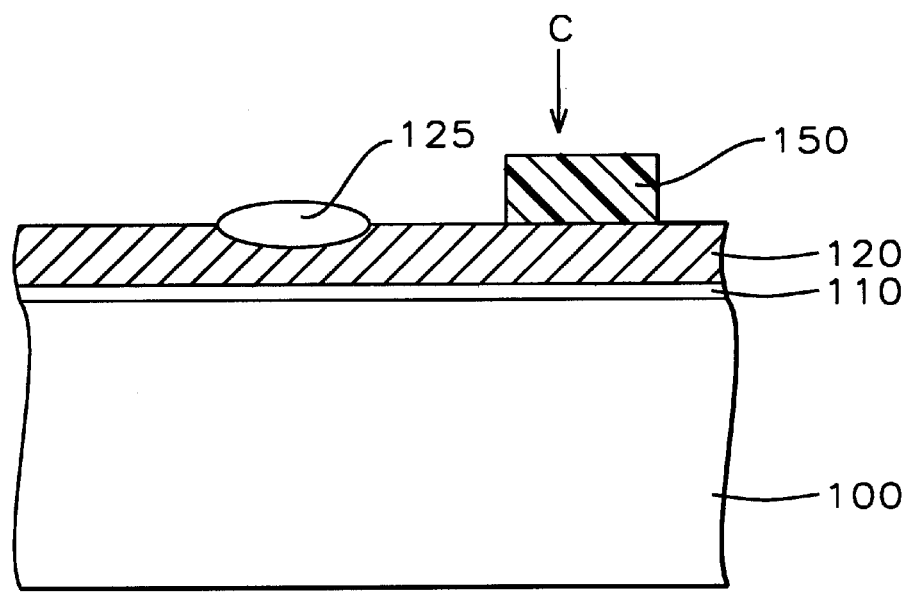
Figure 3F:
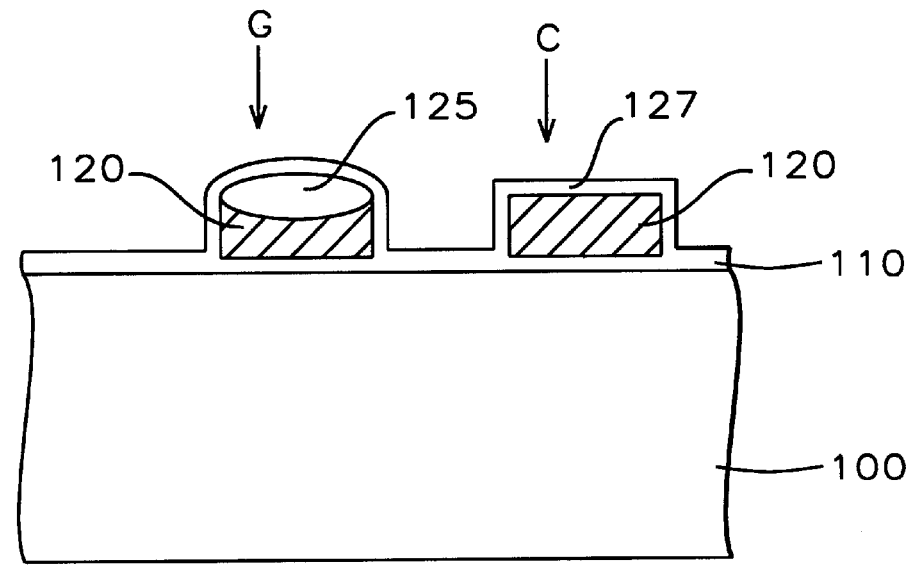

As a main feature and key aspect of the present invention, regions (C) where capacitors are to be formed are defined by forming second photoresist layer (150) and patterned accordingly as shown in FIG. 3e. Polysilicon layer (120) is next etched using recipe $Cl_2$ and HBr, thus forming a floating gate underlying the poly-oxide layer and the first, or bottom electrode of the PIP capacitor of the invention. It will be noted that the same first polysilicon layer (120) forms the floating gate as well as the first electrode as shown in FIG. 3f. However, it will be appreciated by those skilled in the art that the method disclosed here avoids having a thick poly-oxide layer over the first electrode of the PIP capacitor to be formed.

Subsequently, second gate dielectric layer (127) is formed over the substrate, including over the poly-oxide of the floating gate and over the first electrode of the PIP capacitor to be formed. The second gate dielectric layer is thermally formed preferably at a temperature between about 800 to 1000° C., and to a thickness between about 100 to 300 Å.

Figure 3G:
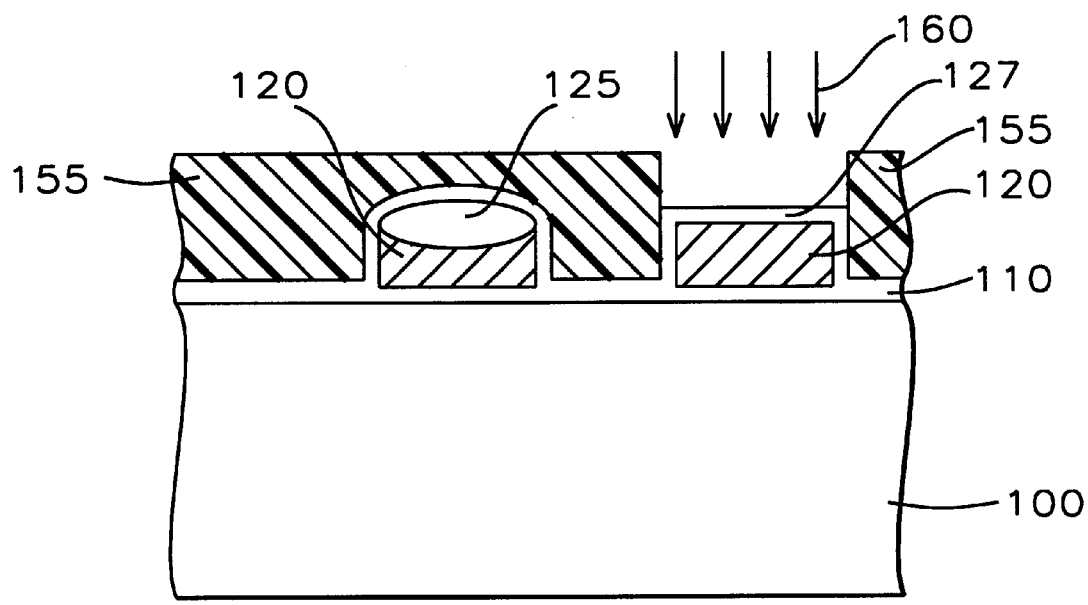

As another key step, it is important that the polysilicon first electrode is implanted once again so that it has a dopant level higher than that of the floating gate. This is accomplished by forming third photoresist layer (155) formed over the substrate, and patterned to form opening (160) over the capacitor region (C), as shown in FIG. 3g. Implanting is then performed through opening (160) preferably with phosphorous ions at a dosage level between about $1\times10^{15}$ to $1\times10^{16}$ atoms/$cm^2$ and energy level between about 10 to 40 KeV.

Figure 3H:
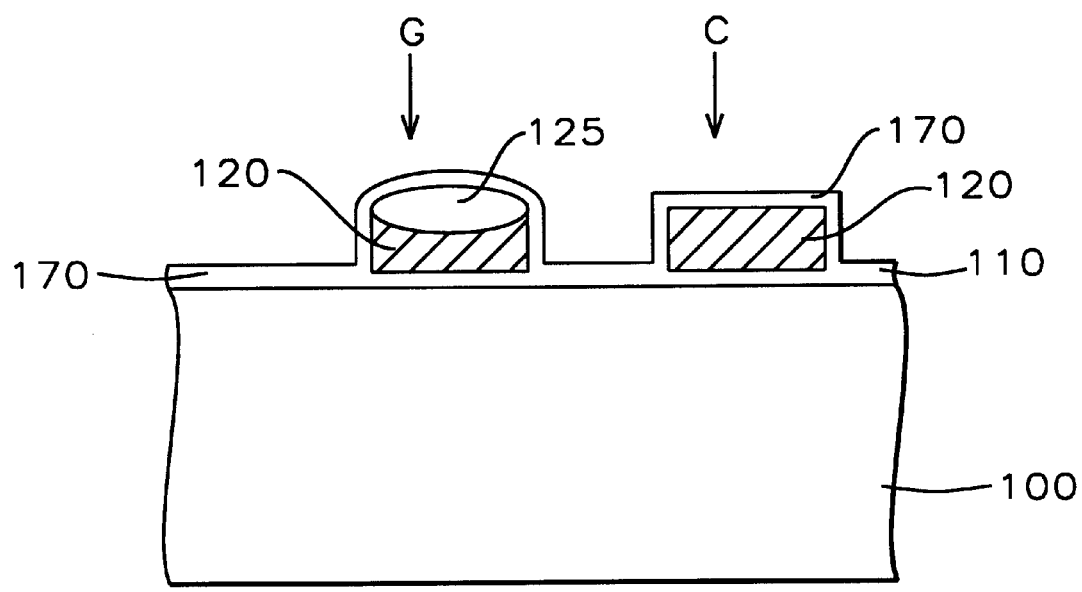

After the implanting of the first electrode, third photoresist layer (155) is removed. Second gate dielectric layer (127) must also be removed as the ion implanting of the previous step may have damaged the dielectric, and, as is well known, a damaged dielectric will then suffer leakage during operation. The removal is accomplished by performing an oxide dip of the entire substrate. It will be known to those skilled in the art that this step does not necessarily require an extra mask step as the periphery of the substrate is usually dipped to remove the oxide layer from the peripheral region. Hydrofluoric solution is used for the oxide dip. Next, a new third gate dielectric layer (170) is formed over the substrate including the gate region (G) and capacitor region (C) as shown in FIG. 3h. It is preferred that a conformal oxide layer having a thickness between about 80 to 200 Å is formed thermally at a temperature between about 800 to 1000° C.

Figure 3I:
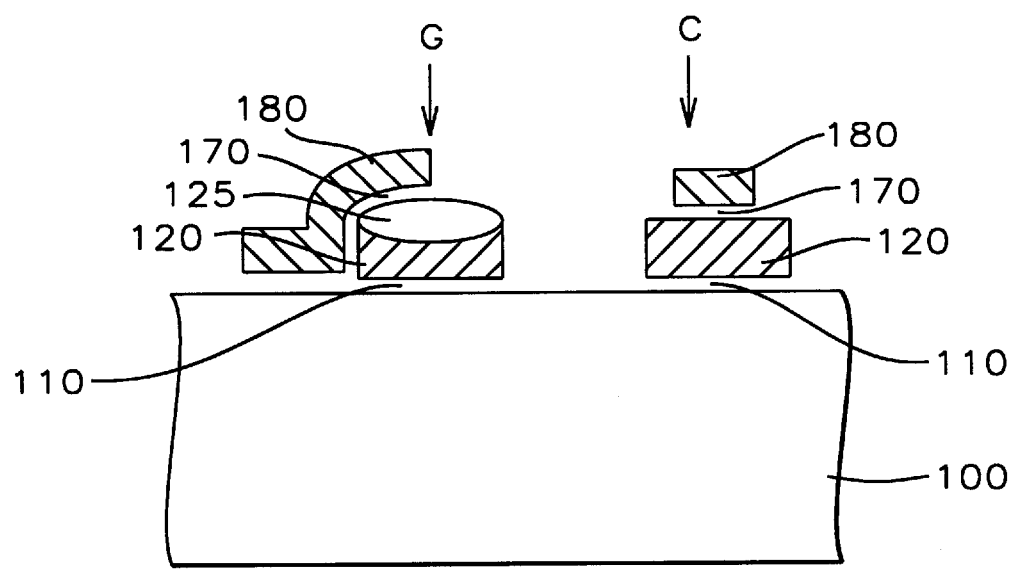

Comparing FIG. 3h with FIG. 2e, it will be noted that layer (170) is essential here, because it will serve as the only insulator layer between the bottom and top plates, or, first and second electrodes, respectively, of the PIP capacitor to be formed in region (C). On the other hand, layer (170) is primarily needed on the sidewalls of the floating gate as an intergate dielectric between floating gate (120) and control gate (180) to be formed next, as shown in FIG. 3i. Poly-oxide layer (125) serves as an insulator on the top portion of the floating gate.

Both the control gate and the second electrode, or the top plate of the capacitor are formed together depositing a second polysilicon layer (180) over the third conformal dielectric layer (170) and patterning it as shown in FIG. 3i. The second polysilicon layer is also formed through an LPCVD method employing silane $SiH_4$ as a silicon source material at a temperature range between about 500 to 700° C. It is preferred that it has a thickness between about 1000 to 3000 Å. The forming of the PIP capacitor along with the split-gate flash memory cell is completed by depositing tungsten silicide (not shown) to make the necessary low resistance contacts for the control gate with the word-line (not shown) and for the PIP capacitor. The preferred thickness of the silicide layer is between about 200 to 500 Å.

It will be apparent to the workers in the field that the disclosed Poly-Interpoly-Poly, or, PIP, capacitor of the present invention has the advantage of employing a thin gate insulator layer in place of the relatively thick poly-oxide layer that is conventionally used. Standard capacitors usually exhibit a unit capacitance in the range between about 0.87 to 0.91 femto-farads (fF)/$\mu m^2$. This is to be compared with a unit capacitance of between about 1.06 to 1.10 measured with the disclosed PIP capacitor. It is found that in addition to the favorable thickness of the third gate dielectric layer of between about 50 to 100 Å, the removal of the damaged second dielectric layer with oxide dip and the use of phosphorous ions in place of arsenic ions also help improve the unit capacitance of the PIP capacitor.

It will be appreciated by those skilled in the art that the disclosed PIP capacitor is especially suitable for manufacture with a split-gate flash process. Such a capacitor can be effectively used as a voltage pump for a flash cell, for instance. Though specific details of the method are disclosed here for a specific application, other similar process steps may be employed for other applications, such as for forming a mixed-mode capacitor in an embedded flash cell.

That is to say, while the invention has been particularly shown and described with reference to the preferred embodiments thereof, it will be understood by those skilled in the art that various changes in form and details may be made without departing from the spirit and scope of the invention.

What is claimed is:

1. A method of forming a PIP (Poly-Interpoly-Poly) capacitor with high capacitance in a split-gate flash memory cell comprising the steps of:

provide a semiconductor substrate having a gate region and a capacitor region;

forming a first gate dielectric layer over said substrate having a gate region and a capacitor region;

forming a first polysilicon layer over said first gate dielectric layer over said gate region and over said capacitor region;

forming a nitride layer over said first polysilicon layer;

forming and patterning a first photoresist layer over said nitride layer to have an opening corresponding to a region on the substrate where a floating gate is to be formed;

etching said nitride layer through said opening in said first photoresist layer to expose a portion of underlying said first polysilicon layer;

ion implanting said portion of said underlying first polysilicon layer through said opening in said nitride layer;

removing said first photoresist layer;

performing oxidization through said opening in said nitride layer, thus forming a poly-oxide layer over said portion of said underlying first polysilicon layer;

removing said nitride layer, thus exposing portions of first polysilicon layer is not covered by said poly-oxide layer;

forming and patterning a second photoresist layer to protect an exposed portion of said first polysilicon layer corresponding to said capacitor region where said PIP capacitor is to be formed;

etching said first polysilicon layer to form said floating gate protected by said poly-oxide layer and to form a first electrode of said PIP capacitor protected by said second photoresist layer in said capacitor region;

forming a second gate dielectric layer over said substrate including said gate region and said capacitor region;

forming and patterning a third photoresist layer to form an opening over said first electrode of said PIP capacitor in said capacitor region;

ion implanting said first polysilicon layer through said opening in said capacitor region to adjust dopant level in said first electrode of said PIP capacitor;

removing said third photoresist layer;

performing an oxide dip to remove said second gate dielectric layer from said substrate;

forming a third gate dielectric layer over said substrate including over said poly-oxide layer over said floating gate, and over said first electrode of said PIP capacitor;

depositing a second polysilicon layer over said third gate dielectric to form a control gate in said gate region, and to form a second electrode of said PIP capacitor in said capacitor region of said split-gate flash memory cell; and forming a silicide layer over said control gate in preparation for forming a word-line over said control gate.

2. The method of claim 1, wherein said forming said first gate dielectric is accomplished by thermally growing an oxide layer at a temperature between about 800 to 1000° C., and to a thickness between about 50 to 200 Å.

3. The method of claim 1, wherein said first gate dielectric layer has a thickness between about 50 to 200 Å.

4. The method of claim 1, wherein said forming said first polysilicon layer is accomplished through an LPCVD method employing silane $SiH_4$ as a silicon source material at a temperature range between about 500 to 700° C.

5. The method of claim 1, wherein said first polysilicon layer has a thickness between about 500 to 2000 Å.

6. The method of claim 1, wherein said forming said nitride layer is accomplished by reacting dichlorosilane ($SiCl_2H_2$) with ammonia ($NH_3$) in an LPCVD at a temperature between about 700 to 800° C.

7. The method of claim 1, wherein said nitride layer has a thickness between about 500 to 2000 Å.

8. The method of claim 1, wherein said etching said nitride layer is accomplished with recipe $CHF_3$ and $CF_4$.

9. The method of claim 1, wherein said ion implanting said first polysilicon layer is performed with phosphorous or arsenic ions at a dosage level between about $1\times10^{15}$ to $1\times10^{16}$ atoms/cm$^2$ and energy level between about 10 to 40 KeV.

10. The method of claim 1, wherein said forming said poly-oxide layer is accomplished by wet-oxidizing said first polysilicon layer.

11. The method of claim 1, wherein said poly-oxide layer has a thickness between about 500 to 2000 Å.

12. The method of claim 1, wherein said removing said nitride layer is accomplished with recipe comprising phosphoric acid $H_3PO_4$.

13. The method of claim 1, wherein said etching said first polysilicon layer to form said floating gate and said first electrode of said PIP capacitor is accomplished with recipe $Cl_2$ and HBr.

14. The method of claim 1, wherein said second gate dielectric is formed by thermally growing an oxide layer at a temperature between about 800 to 1000° C.

15. The method of claim 1, wherein said second gate dielectric layer has a thickness between about 30 to 100 Å.

16. The method of claim 1, wherein said ion implanting of said first polysilicon layer in said capacitor region to adjust dopant level in said first electrode of said PIP capacitor is accomplished with phosphorous ions at a dosage level between about $1\times10^{15}$ to $\times10^{16}$ atoms/cm$^2$ and energy level between about 10 to 40 KeV.

17. The method of claim 1, wherein said performing said oxide dip to remove said second gate dielectric layer from said substrate is accomplished with HF hydrofluoric solution.

18. The method of claim 1, wherein said third gate dielectric is thermal oxide grown at a temperature between about 800 to 1000° C. to a thickness between about 100 to 500 Å.

19. The method of claim 1, wherein said depositing said second polysilicon layer is accomplished through an LPCVD method employing silane $SiH_4$ as a silicon source material at a temperature range between about 500 to 700° C.

20. The method of claim 1, wherein said second polysilicon layer has a thickness between about 1000 to 3000 Å.

21. The method of claim 1, wherein said silicide layer silicided tungsten with a thickness between about 200 to 500 Å.

* * * * *